US008022724B1

(12) United States Patent
Jenkins, IV

(10) Patent No.: US 8,022,724 B1
(45) Date of Patent: Sep. 20, 2011

(54) METHOD AND INTEGRATED CIRCUIT FOR SECURE RECONFIGURATION OF PROGRAMMABLE LOGIC

(75) Inventor: Jesse H. Jenkins, IV, Danville, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/625,864

(22) Filed: Nov. 25, 2009

(51) Int. Cl.
*H03K 19/00* (2006.01)
*H03K 19/173* (2006.01)
*H01L 25/00* (2006.01)
*G06F 11/30* (2006.01)
*G06F 13/00* (2006.01)

(52) U.S. Cl. ............... 326/38; 326/8; 326/41; 326/47; 326/101; 713/193; 713/194; 711/163; 711/164

(58) Field of Classification Search .......... 326/8, 37–41, 326/47, 101; 713/193, 194; 711/163, 164
See application file for complete search history.

(56) References Cited

U.S. PATENT DOCUMENTS

| | | | |
|---|---|---|---|
| 1,310,719 A | 7/1919 | Vernam | |
| 6,441,641 B1 * | 8/2002 | Pang et al. | 326/41 |
| 6,711,674 B1 | 3/2004 | Burnham | |
| 6,748,368 B1 | 6/2004 | Trimberger et al. | |
| 6,894,527 B1 * | 5/2005 | Donlin et al. | 326/8 |
| 6,957,340 B1 * | 10/2005 | Pang et al. | 713/189 |
| 6,981,153 B1 * | 12/2005 | Pang et al. | 713/194 |
| 7,191,342 B1 | 3/2007 | New et al. | |
| 7,345,502 B1 | 3/2008 | Lakkapragada | |
| 7,366,306 B1 * | 4/2008 | Trimberger | 380/278 |
| 7,519,823 B1 | 4/2009 | Schumacher et al. | |
| 7,607,025 B1 | 10/2009 | Trimberger | |
| 7,675,313 B1 * | 3/2010 | Tang et al. | 326/8 |
| 7,741,865 B1 * | 6/2010 | Sharpe-Geisler et al. | 326/14 |
| 7,834,652 B1 * | 11/2010 | Tang et al. | 326/8 |
| 7,868,646 B1 * | 1/2011 | Sharpe-Geisler et al. | 326/14 |
| 2007/0288765 A1 * | 12/2007 | Kean | 713/193 |

OTHER PUBLICATIONS

U.S. Appl. No. 11/151,985, filed Jun. 14, 2005, Trimberger.
U.S. Appl. No. 12/353,234, filed Jan. 13, 2009, Tsai.
U.S. Appl. No. 12/565,138, filed Sep. 23, 2009, Sabih et al.
Shannon, Claude E., "Communication Theory of Secrecy Systems," *Bell Labs Technical Journal*, Oct. 1949, pp. 656-715, vol. 28, John Wiley & Sons, New York, New York, USA.

* cited by examiner

*Primary Examiner* — Shawki Ismail
*Assistant Examiner* — Thienvu Tran
(74) *Attorney, Agent, or Firm* — LeRoy D. Maunu; Lois D. Cartier

(57) ABSTRACT

Approaches for secure configuration of a programmable logic integrated circuit (IC). In one approach, a method includes programming configuration memory of the programmable logic IC with a first configuration bitstream. At least a portion of a second configuration bitstream is encrypted using values stored in a portion of the configuration memory as a key. The second configuration bitstream is input to the programmable logic IC, and the encrypted portion of the second configuration bitstream is decrypted using the values stored in the portion of the configuration memory. The configuration memory is then programmed with each decrypted portion of the second bitstream.

11 Claims, 6 Drawing Sheets

FIG. 4-1

| 402 Configuration Bitstream Header | 404 Frame Dest Addr | 406 Frame Key Addr | 408 Frame 1 Data | 404 Frame Dest Addr | 406 Frame Key Addr | 408 Frame 2 Data | ... | 404 Frame Dest Addr | 406 Frame Key Addr | 408 Frame N Data | 410 End tokens +Hash |

FIG. 4-2

| 402 Configuration Bitstream Header | 404 Frame Dest Addr | 406 Frame Key Addr | 408 Frame 1 Data | 412 Hash | 404 Frame Dest Addr | 406 Frame Key Addr | 408 Frame 2 Data | 412 Hash | ... | 410 End tokens |

METHOD AND INTEGRATED CIRCUIT FOR SECURE RECONFIGURATION OF PROGRAMMABLE LOGIC

FIELD OF THE INVENTION

The present invention generally relates to encryption, and more particularly to the encryption of data used to reconfigure programmable logic.

BACKGROUND

Programmable Logic Circuits are Integrated Circuits (ICs) that are user configurable and capable of implementing digital logic operations. There are several types of programmable logic ICs, including Complex Programmable Logic Devices (CPLDs) and Field Programmable Gate Arrays (FPGAs), for example. CPLDs include function blocks based on programmable logic array (PLA) architecture and programmable interconnect lines to route and transmit signals between the function blocks. FPGAs may include configurable logic blocks (CLBs) arranged in rows and columns, input output blocks (IOBs) surrounding the CLBs, and programmable interconnect lines that route and transmit signals between the CLBs. In other FPGAs, IOBs are arranged in columns between the columns of other logic. Each CLB includes look-up tables and other configurable circuitry that is programmable to implement a logic function. The function blocks of CPLDs, CLBs of FPGAs and interconnect lines are configured by data stored in a configuration memory of the respective devices.

Designs implemented in programmable logic have become complex. Due to the time and investment required for design and debugging, when the design is going into a system including the programmable logic, it is desirable to protect the design from unauthorized copying.

Many programmable logic ICs use volatile configuration memory that must be loaded from an external device, such as a Programmable Read-Only Memory (PROM), every time the programmable logic is powered up. Since configuration data is stored external to the programmable logic and must be transmitted through a configuration access port, the design can easily be revealed to an attacker by monitoring the data on the configuration access port during configuration.

Other programmable logic ICs, including some FPGAs, include at least some non-volatile configuration memory within the device. However, even when a device is configured with internally stored configuration memory, configuration data can still be accessed if the designer releases configuration data to update the device.

Efforts have been made to encrypt designs, but it is difficult to make the design both secure from attackers and easy to upgrade by legitimate users. Several encryption algorithms, for example, the standard Data Encryption Standard (DES) and the more secure Advanced Encryption Standard (AES) algorithms, are known for encrypting blocks of data. Additionally, a one-time encryption pad may be used as a cipher for encrypting blocks of data by XORing blocks of data with blocks of the one-time pad (OTP). However, a key must somehow be communicated in a secure way to the structure that decrypts the design, so the design can be decrypted before being used to configure the programmable logic. Once the programmable logic has been configured using the unencrypted design, the design must continue to be protected from unauthorized discovery.

A decryption key can be stored in non-volatile memory of a programmable logic integrated circuit. An encrypted bitstream can then be loaded into the IC and decrypted using the key within the programmable logic. This prevents an attacker from reading the bitstream as it is being loaded into the programmable logic IC. However, this structure does not protect the user's design from all modes of attack. A reverse engineering process in which the programmed device is decapped, metal layers are removed, and the non-volatile memory cells are chemically treated can expose which memory cells have been charged and thus can allow an attacker to learn the decryption key. There remains a need for a design protection method that is convenient, reliable, and secure.

The present invention may address one or more of the above issues.

SUMMARY

In one embodiment of the present invention, a method for secure configuration of a programmable logic IC is provided. Configuration memory of the programmable logic IC is programmed with a first configuration bitstream. At least a portion of a second configuration bitstream is then encrypted using values stored in a portion of the configuration memory as a key. The second configuration bitstream is then transferred to the programmable logic integrated circuit. Once the second configuration bitstream has been input into the programmable logic IC, the encrypted portion of the second configuration bitstream is decrypted using the values stored in the portion of the configuration memory as the key. The configuration memory is then programmed with each decrypted portion of the second bitstream.

In another embodiment of the present invention, a programmable logic integrated circuit is provided. The integrated circuit includes configuration memory, programmable logic resources coupled to the configuration memory, programmable interconnection resources to the configuration memory and programmable logic resources, and a configuration controller circuit coupled to the configuration memory. The configuration controller circuit is configured to decrypt input configuration data using values stored in a portion of the configuration memory as a decryption key. The configuration controller is further configured to program the configuration memory of the integrated circuit with the decrypted input configuration data.

In yet another embodiment of the present invention, an article of manufacture is provided. The article of manufacture is characterized by a processor-readable storage medium configured with processor-executable instructions for processing a circuit design. When the instructions are executed by a processor the instructions cause the processor to encrypt at least a portion of a configuration bitstream using values stored in a portion of a configuration memory contained in a programmable logic integrated circuit as a key. The instructions further cause the processor to input the second configuration bitstream to the programmable logic integrated circuit. The integrated circuit is configured to decrypt the encrypted portion of the configuration bitstream using the values stored in the portion of the configuration memory. The integrated circuit is also configured to program the configuration memory of the integrated circuit with each decrypted portion of the second bitstream.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which:

FIGS. 4-1 illustrates, as an example, a bitstream for secure configuration of programmable logic in accordance with several embodiments of the invention;

FIGS. 4-2 illustrates, as an example, a second bitstream for secure configuration of programmable logic in accordance with several embodiments of the invention;

DETAILED DESCRIPTION

When a circuit design is implemented in programmable logic, it is desirable to be able to update the implemented design at a later time to fix a design flaw or enable additional features. This is done by generating a configuration bitstream of the design with incorporated updates and loading the configuration bitstream onto programmable logic implementing the previous design. The logic is then reconfigured using the configuration bitstream. Because the configuration bitstream data can be intercepted during configuration and used to make unauthorized copies of the design, it is desirable to encrypt the configuration bitstream. The encrypted configuration bitstream can then be decrypted within the programmable logic and discarded once configuration has completed.

However, a decryption key must securely be communicated to the programmable logic to enable encryption. A decryption key either can be transmitted to the programmable logic or can be stored internally in registers or memory of the device. A transmitted decryption key is not secure as the key itself can be intercepted. Decryption keys stored internally within memory are secure but can only store a limited number of keys due to memory requirements. Furthermore, if decryption keys are reused after a number of reconfigurations, analysis can lead to the discovery of the internally stored keys.

The present invention provides a method and integrated circuit for secure configuration of a programmable logic integrated circuit using the current configuration data of the integrated circuit as a decryption key. Because configuration data changes upon each configuration, keys are unlikely to be exhausted as a new data set becomes available upon each configuration.

Figure 1:
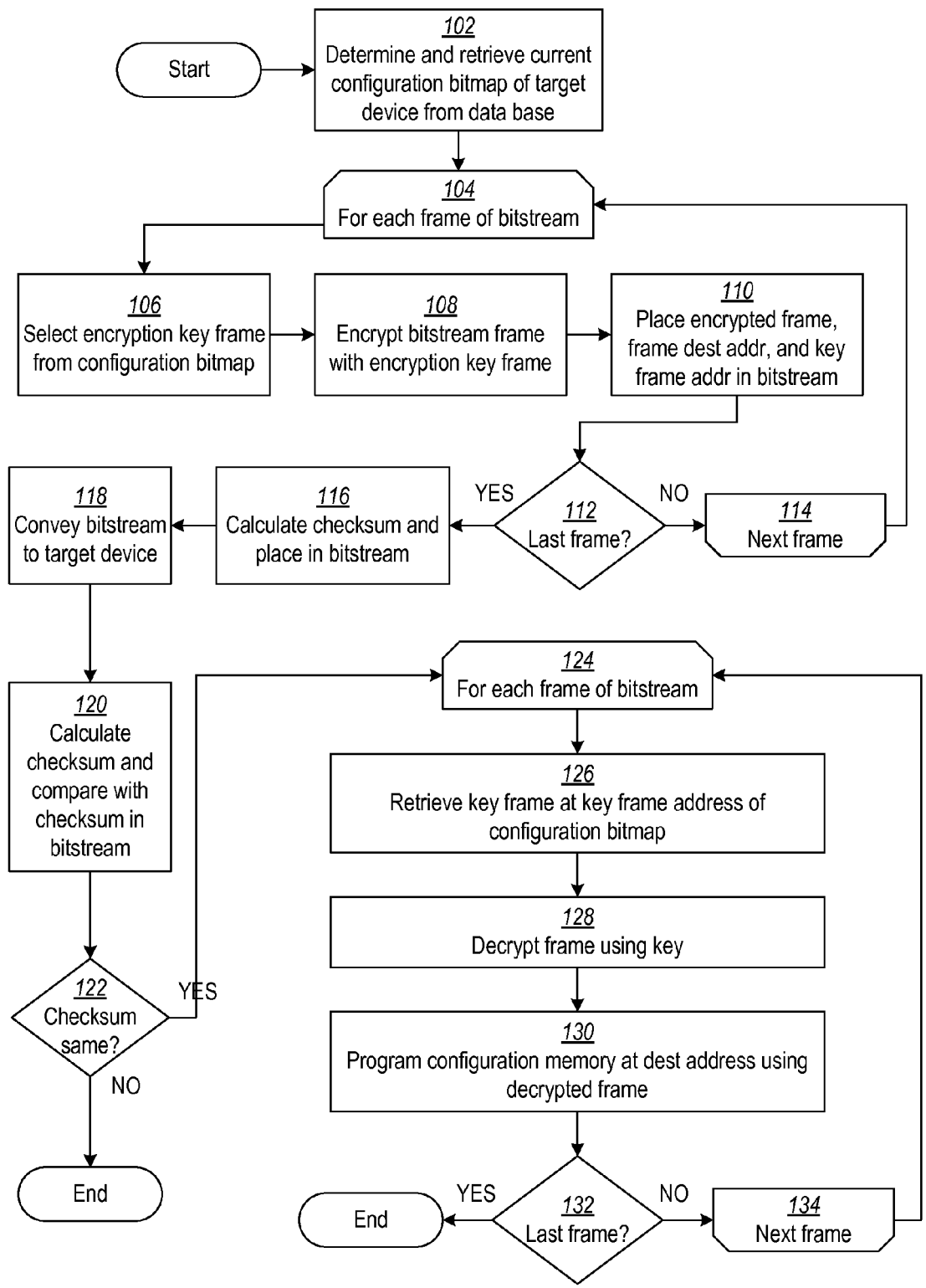
FIG. 1 illustrates a flowchart of a process to securely configure programmable logic in accordance with several embodiments of the invention.

FIG. 1 illustrates a flowchart of a process to securely configure programmable logic in accordance with several embodiments of the invention. The target programmable logic IC to be configured is determined and a stored configuration memory bitmap indicating the current configuration of the programmable logic is retrieved from a database at step 102. Each frame of configuration data is encrypted and added to the bitstream at step 104. For each frame in the encryption process, a frame from the retrieved configuration memory bitmap is selected as an encryption key at step 106. The frame is encrypted with the selected key frame at step 108. The encrypted frame, the destination address for the frame in configuration memory, and the address of the key frame in the configuration memory bitmap is added to the bitstream at step 110. When all frames have been encrypted and added to the bitstream (decision step 112), a checksum value is computed and appended to the bitstream at step 116. The encrypted bitstream including checksum value is conveyed to the target IC at step 118.

Once the bitstream has been conveyed to the target IC, the checksum of the bitstream is recalculated at step 120 and compared with the checksum stored in the bitstream at step 122. If the checksums do not match, the configuration is aborted. If the checksums match, each frame is decrypted at step 124. For each frame read into the target IC (step 124), the IC retrieves the key frame from the configuration memory at the key frame address as shown by step 126. The frame is then decrypted with the key frame at step 128, and the decrypted frame is then used to program the portion of the configuration memory located at the destination address 130. The decryption process retrieves the next frame from the bitstream at step 134 and repeats until there are no more frames left in the bitstream (decision step 132).

It is understood that any number of block or stream encryption algorithms may be used to encrypt and decrypt bitstream frames including, XOR, DES, AES, TEA, Blowfish, or RSA. Additionally, in some embodiments of the invention, frame data is padded before encryption to further secure encryption data (not shown). Pad information is discarded once frames have been decrypted.

Any number of selection algorithms may be used to select portions of the current bitmap configuration that will be used to encrypt and decrypt each key. For example, two frames of the bitstream may be encrypted with the same frame of the current bitmap configuration or may be encrypted with two different frames of the bitmap configuration. Further, programmable logic configuration data generally trends to a greater number of zeros. This trend may be exploited to crack a cipher and reveal the unencrypted design. To avoid this exploit, encryption key frames of the current configuration may be chosen to achieve a greater balance of binary values and increase randomization of the encrypted bitstream.

Additionally, only a portion of the available programmable logic is typically consumed by a design. As a result, there will be regions of programmable logic where no design is implemented. To further obstruct reverse engineering based on the blank regions and increase the number of keys available for further configurations, various embodiments of the invention generate pseudo-random configuration data for the blank regions. Circuits which include parity, EX-OR/NOR and mixes of combinational and sequential elements can be constructed to benignly fit into these blank regions without affecting the overall circuit behavior. Such circuits are limited only in that they cannot interconnect or interfere with components of the original design.

Figure 2:
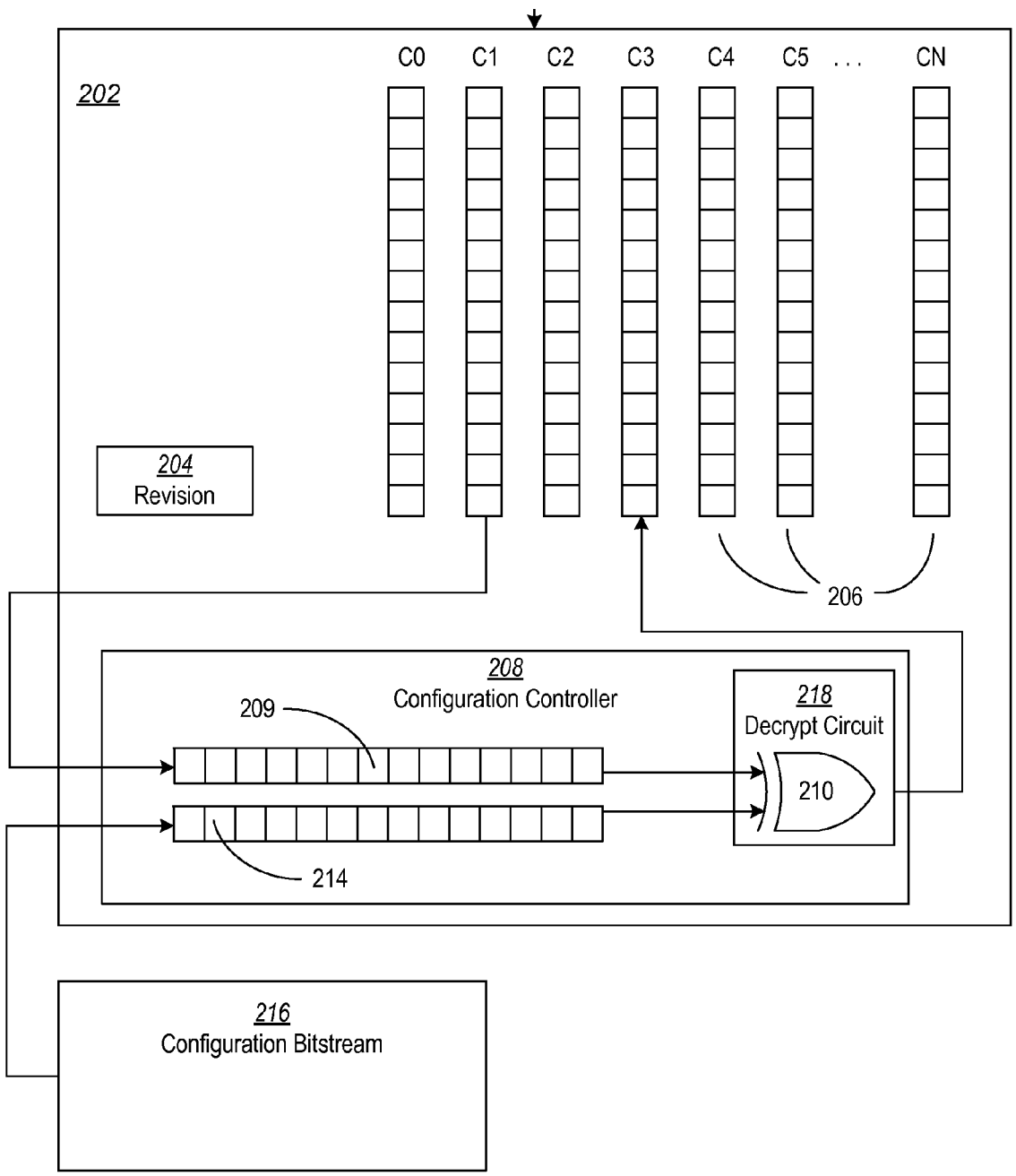
FIG. 2 illustrates a block diagram of a programmable logic integrated circuit configured to perform secure configuration in accordance with several embodiments of the invention.

FIG. 2 illustrates a block diagram of a programmable logic IC configured in accordance with several embodiments of the invention. Programmable logic IC 202 includes configuration memory frames 206, a revision number memory element 204, and a configuration controller 208. The configuration controller is equipped with a key frame buffer 209 and a bitstream frame buffer 214. Frames of configuration data are read into the programmable logic IC from the configuration bitstream 216, and each frame of configuration data is placed into the bitstream frame buffer 214. The configuration memory frame corresponding to the key frame address is read into the key frame buffer 209. The data in the buffers are shifted into a decryption circuit 218. In this example, the decryption circuit 218 is implemented by an Exclusive-OR gate 210. The decrypted frame is then stored in the configuration memory at the proper destination address.

Figure 3:
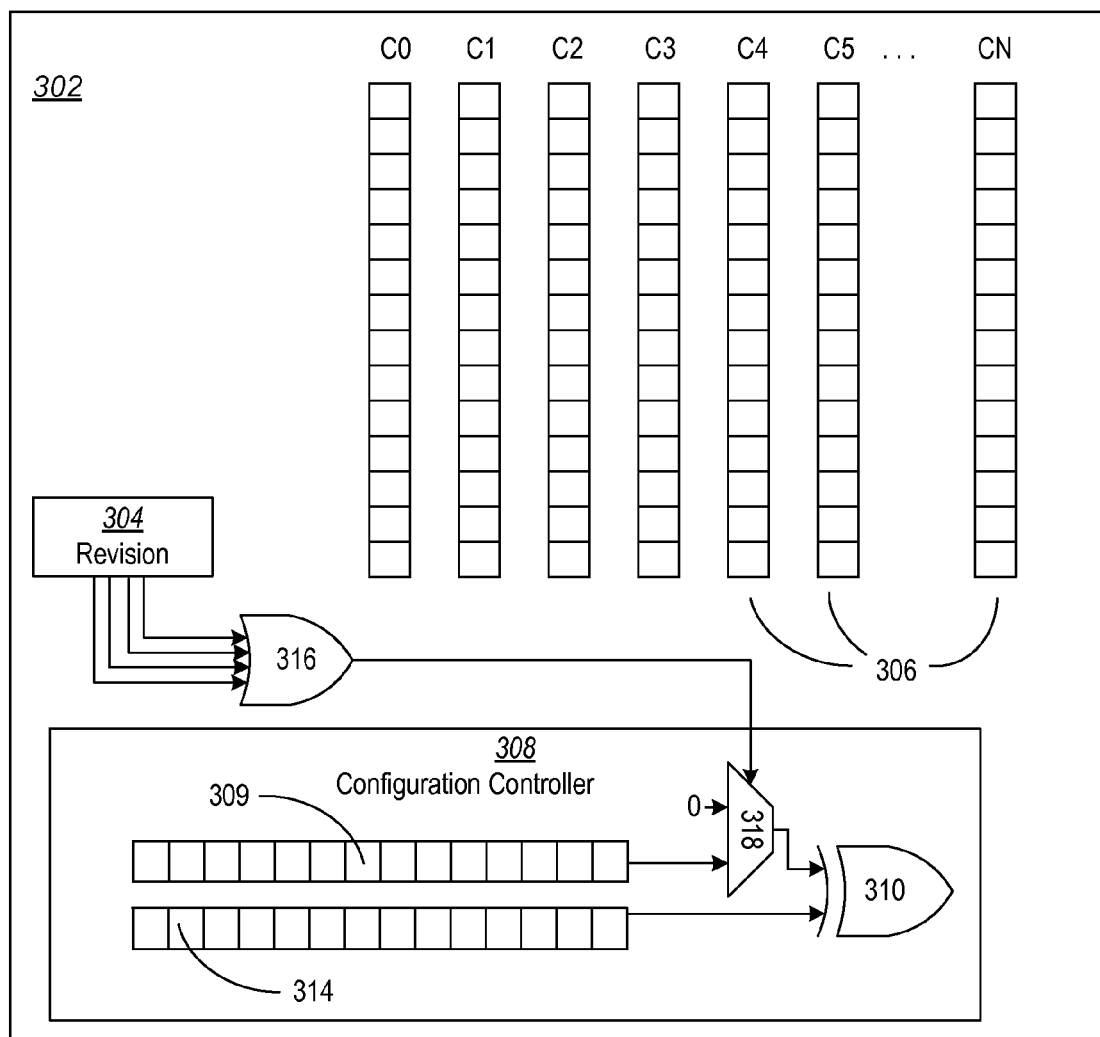
FIG. 3 illustrates a block diagram of a programmable logic integrated circuit configured to use a predetermined bit-string as the decryption key the first time the programmable logic IC is configured.

FIG. 3 illustrates, as an example, the programmable logic IC of FIG. 2 configured to use a predetermined bit-string as the decryption key the first time the programmable logic is configured. Configuration controller 308 is configured with a MUX 318. The MUX selects the decryption key from either the key frame buffer 306 or the predetermined string. The selection of MUX 318 is controlled by OR gate 316 which determines whether revision memory element 304 is equal to zero.

The OR gate 316 has an input corresponding to each bit of the revision memory element 304. If the revision number is non-zero, at least one input of OR gate 316 will be equal to logical one. As a result, a logical one would then be generated by the OR gate and would trigger MUX 318 to select key frame buffer 309 as the decryption key. If the IC is initially configured with a revision number equal to zero, zeros will be present at the inputs of OR gate 316, resulting in the generation of a logical zero at the selection input of MUX 318. As a result, the MUX will select a string of zeroes for the initial decryption key. It is understood that any number of predetermined strings may be used as the initial decryption key such as a string of ones or a string of alternating ones and zeroes.

For secure operation, the programmable logic ICs shown in FIGS. 2 and 3 are configured to prevent a user from reading out configuration data but allow read out of the revision number. The revision number is used to ensure that a configuration bitstream has been encrypted with the correct key. Configuration using configuration data decrypted with the incorrect key would result in overwriting the known configuration data and would render the programmable logic IC inoperable. The revision number is read out to allow a configuration program, which is responsible for loading the bitstream onto the programmable logic IC, to verify that the revision number of the programmable logic corresponds to the configuration memory bitmap that was used to encrypt the configuration bitstream. In some embodiments of the invention, the programmable logic ICs shown in FIGS. 2 and 3 further include revision number verification circuitry (not shown) to determine if the revision number of the programmable logic corresponds to a bitmap configuration that was used to encrypt the configuration bitstream. If it is determined that the bitstream was not encrypted with the bitmap corresponding to current revision number of the programmable logic, the configuration is aborted.

It is further understood that the configuration controllers 208 and 308 shown in FIGS. 2 and 3 may be implemented by dedicated hardware on a programmable logic IC or by programmable logic configured during the initial configuration.

FIGS. 4-1 and 4-2 illustrate example formats of bitstreams for secure configuration of a programmable logic in accordance with several embodiments of the invention. The bitstream shown in FIGS. 4-1 begins with a configuration bitstream header 402, which is used to synchronize the data transmission of the bitstream between a transmitting device, such as a workstation, and the receiving programmable logic IC. The bitstream header is followed by a series of frames consisting of frame data segments 408 and frame addressing segments 404 and 406. Each frame data segment 408 is preceded by a frame destination address 404 that holds the address of the configuration memory that will be overwritten by the frame data. Each frame data segment is also preceded by a frame key address 406 that contains the address of the portion of the configuration memory that will be used to decrypt the contents in the frame data segment 408.

Following the frame data segments 408 and corresponding addressing segments 404 and 406, the bitstream ends with configuration bitstream end tokens 410. The bitstream end tokens signal to the programmable logic IC that there are no further frame data packets to read. In several embodiments of the present invention, the bitstream end tokens include a checksum value of the entire bitstream. As discussed above, the checksum is used to ensure that transmission of the bitstream to the programmable logic IC occurred without error.

In some embodiments of the invention, the checksum hash value is computed on a frame-by-frame basis. FIGS. 4-2 illustrates, as an example, a configuration bitstream with hash values computed for each frame. For each group of segments corresponding to a frame 404, 406, and 408, hash value 412 is computed and appended to the bitstream following each data frame 408.

It is understood that the data segment 408, and address segments 404 and 406 of each frame may be arranged according to a number of different arrangement schemes in the configuration bitstream. For example, the configuration bitstream may be constructed such that address segments 404 and 406 follow the corresponding data segment 408.

Figure 5:
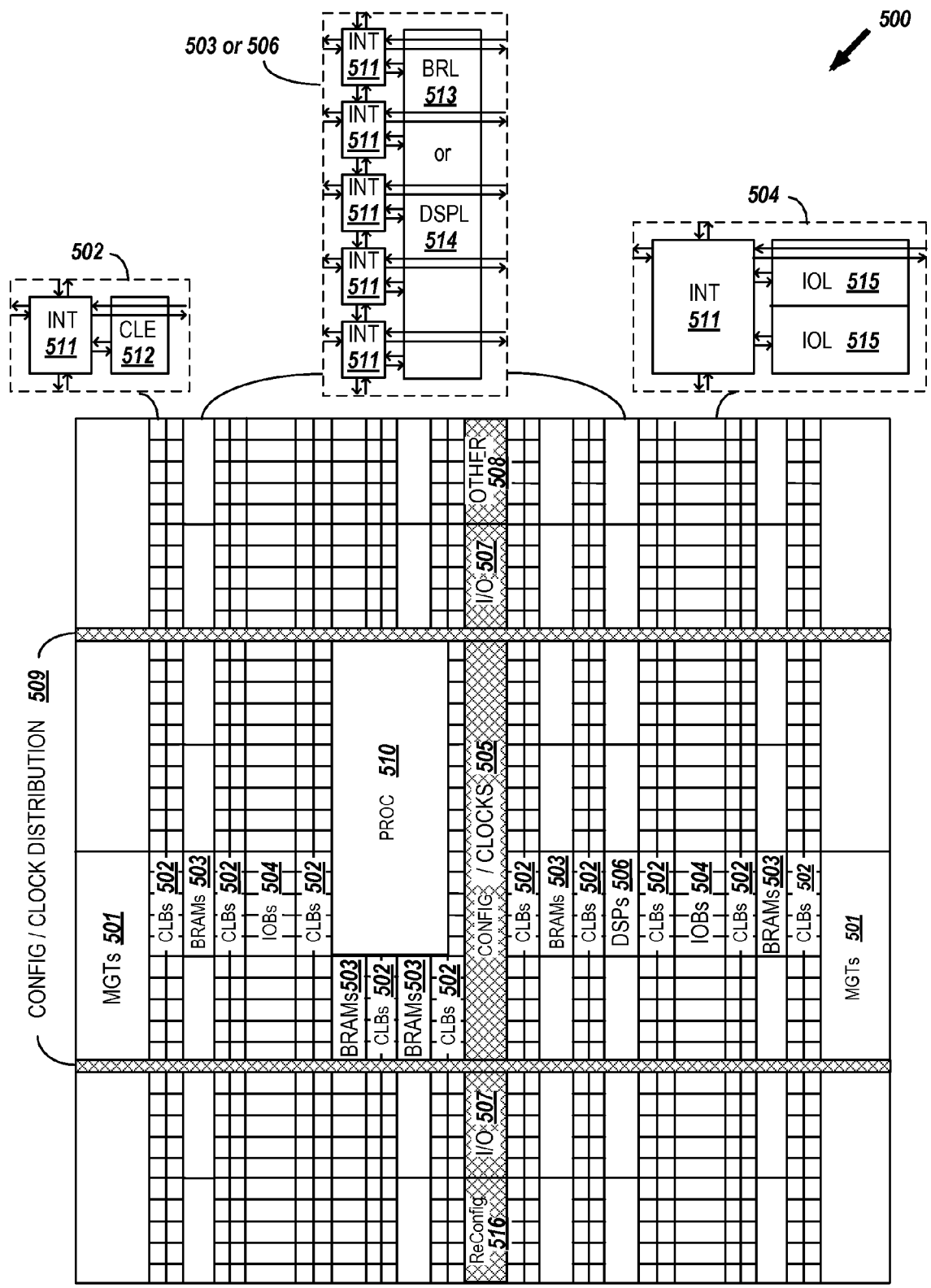
FIG. 5 illustrates a block diagram of a programmable integrated circuit for implementing programmable logic in accordance with various embodiments of the invention.

FIG. 5 is a block diagram of an example field programmable gate array (FPGA) which is configurable in accordance with various embodiments of the invention. FPGAs can include several different types of programmable logic blocks in the array. For example, FIG. 5 illustrates an FPGA architecture (500) that includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), a reconfiguration port (RECONFIG. 516), specialized input/output blocks (I/O 507), for example, clock ports, and other programmable logic 508 such as digital clock managers, analog-to-digital converters, system monitoring logic, and so forth. Some FPGAs also include dedicated processor blocks (PROC 510).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element INT 511 also includes the connections to and from the programmable logic element within the same tile, as shown by the examples included at the top of FIG. 5.

For example, a CLB 502 can include a configurable logic element CLE 512 that can be programmed to implement user logic plus a single programmable interconnect element INT 511. A BRAM 503 can include a BRAM logic element (BRL 513) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 506 can include a DSP logic element (DSPL 514) in addition to an appropriate number of programmable interconnect elements. An 10B 504 can include, for example, two instances of an input/output logic element (IOL 515) in addition to one instance of the programmable interconnect element INT 511. As will be clear to those of skill in the art, the actual I/O pads connected, for example, to the I/O logic element 515 are manufactured using metal layered above the various illustrated logic blocks, and typically are not confined to the area of the input/output logic element 515.

In the pictured embodiment, a columnar area near the center of the die (shown shaded in FIG. 5) is used for configuration, clock, and other control logic. Horizontal areas 509 extending from this column are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks can be programmable blocks and/or dedicated logic. For example, the processor block PROC 510 shown in FIG. 5 spans several columns of CLBs and BRAMs.

Note that FIG. 5 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 5 are purely exemplary. For example, in an actual FPGA more than one adjacent column of CLBs is typically included wherever the CLBs appear, to facilitate the efficient implementation of user logic.

Figure 6:
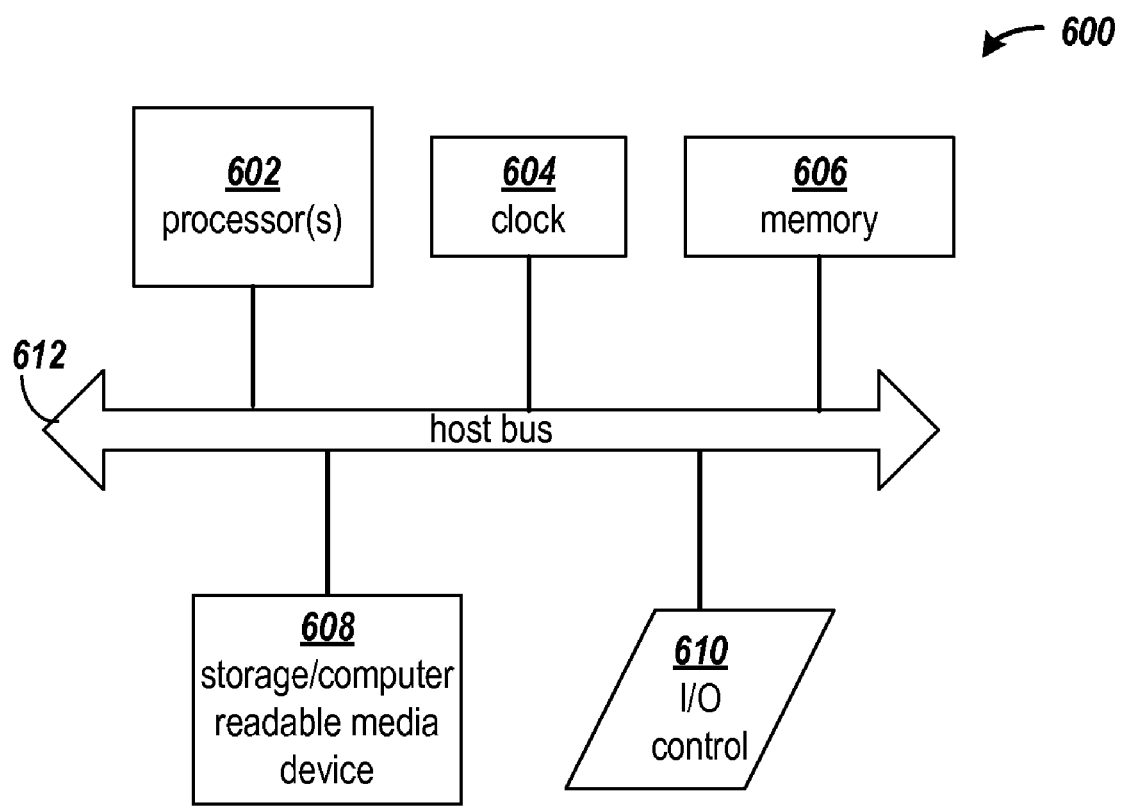
FIG. 6 illustrates a block diagram of a computing arrangement for implementing a secure configuration of programmable logic in accordance with various embodiments of the invention.

FIG. 6 illustrates a block diagram of a computing arrangement for implementing a secure configuration of a programmable logic in accordance with various embodiments of the invention. Those skilled in the art will appreciate that various alternative computing arrangements, including one or more processors and a memory arrangement configured with program code, would be suitable for hosting the processes and data structures and implementing the algorithms of the different embodiments of the present invention. The computer code, comprising the processes of the present invention encoded in a processor executable format, may be stored and provided via a variety of computer-readable storage media or delivery channels such as magnetic or optical disks or tapes, electronic storage devices, or as application services over a network.

Processor computing arrangement 600 includes one or more processors 602, a clock signal generator 604, a memory unit 606, a storage unit 608, and an input/output control unit 610 coupled to host bus 612. The arrangement 600 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor 602 may be one or more general purpose processors, or a combination of one or more general purpose processors and suitable co-processors, or one or more specialized processors (e.g., RISC, CISC, pipelined, etc.).

The memory arrangement 606 typically includes multiple levels of cache memory and a main memory. The storage arrangement 608 may include local and/or remote persistent storage such as provided by magnetic disks (not shown), flash, EPROM, or other non-volatile data storage. The storage unit may be read or read/write capable. Further, the memory 606 and storage 608 may be combined in a single arrangement.

The processor arrangement 602 executes the software in storage 608 and/or memory 606 arrangements, reads data from and stores data to the storage 608 and/or memory 606 arrangements, and communicates with external devices through the input/output control arrangement 610. These functions are synchronized by the clock signal generator 604. The resource of the computing arrangement may be managed by either an operating system (not shown), or a hardware control unit (not shown).

The present invention is thought to be applicable to a variety of systems for a data bus controller. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

Those skilled in the art will appreciate that various alternative computing arrangements, including one or more processors and a memory arrangement configured with program code, would be suitable for hosting the processes and data structures of the different embodiments of the present invention.

What is claimed is:

1. A method for secure configuration of a programmable logic integrated circuit (IC), comprising:
    programming configuration memory of the programmable logic IC with a first configuration bitstream;
    storing a configuration memory address of a portion of the configuration memory in a second configuration bitstream;
    encrypting at least a portion of the second configuration bitstream using values stored in the portion of the configuration memory as a key;
    inputting the second configuration bitstream to the programmable logic IC;
    decrypting the encrypted portion of the second configuration bitstream using the values stored in the portion of the configuration memory;
    wherein the decrypting of the encrypted portion of the second configuration bitstream includes retrieving the key from the configuration memory at the configuration memory address; and
    programming the configuration memory with each decrypted portion of the second bitstream.

2. The method as in claim 1, wherein the portion of the second configuration bitstream is encrypted and decrypted by performing a bitwise Exclusive-OR operation on the portion using the values stored in the portion of the configuration memory.

3. The method as in claim 1, wherein the portion of a second configuration bitstream and the portion of the configuration memory are a size equal to one column of the configuration memory.

4. The method as in claim 1, wherein the programmable logic IC is configured to prevent readout of configuration memory.

5. The method as in claim 1, wherein programming the configuration memory further comprises storing a first revision number on the programmable logic IC.

6. The method as in claim 5, further comprising storing a second revision number in the second configuration bitstream.

7. The method as in claim 6, further comprising:
    reading the first revision number from the programmable logic IC;
    comparing the first revision number to the second revision number from the second configuration bitstream; and
    wherein the inputting, decrypting, and programming the configuration memory with the decrypted portion are performed in response to determining the second revision number corresponds to an update of the configuration corresponding to the first revision number.

8. The method as in claim 6, further comprising:
configuring the programmable logic IC to compare the first revision number stored on the programmable logic IC to the second revision number of the second configuration bitstream;
comparing the first and second revision numbers; and
wherein the decrypting and programming of the configuration memory with the decrypted portion are performed in response to the first and revision numbers being equal.

9. The method as in claim 1, wherein the first and second configuration bitstreams include pseudo-random data for programming unused configuration memory of the programmable logic IC.

10. An article of manufacture, comprising:
a processor-readable storage medium configured with processor-executable instructions for processing a circuit design, the instructions when executed by a processor causing the processor to:
store a configuration memory address of a portion of a configuration memory in a configuration bitstream; and
encrypt at least a portion of the configuration bitstream using values stored in the portion of the configuration memory contained in a programmable logic integrated circuit as a key;
input the configuration bitstream to the programmable logic IC; and
wherein the programmable logic IC is configured to:
decrypt the encrypted portion of the configuration bitstream using the values stored in the portion of the configuration memory;
wherein the decryption of the encrypted portion of the configuration bitstream includes retrieval of the key from the configuration memory at the configuration memory address; and
program the configuration memory with each decrypted portion of the bitstream.

11. The article of manufacture of claim 10, wherein the instructions cause the processor to encrypt the portion of the configuration bitstream by performing a bitwise Exclusive-OR operation on the portion using the stored values in the portion of the configuration memory.

* * * * *